(12) United States Patent
Kafka et al.

(10) Patent No.: US 6,421,573 B1
(45) Date of Patent: *Jul. 16, 2002

(54) QUASI-CONTINUOUS WAVE LITHOGRAPHY APPARATUS AND METHOD

(75) Inventors: James D. Kafka, Mountain View; Bruce Craig, Los Gatos, both of CA (US)

(73) Assignee: Spectra Physics Lasers, Inc., Mountain View, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/322,121

(22) Filed: May 27, 1999

(51) Int. Cl.[7] ............................................... G06F 19/00
(52) U.S. Cl. ...................................................... 700/121
(58) Field of Search ............................ 700/121; 372/71, 372/6, 39; 438/597; 716/8, 9, 11, 12, 16, 19–21

(56) References Cited

U.S. PATENT DOCUMENTS

| | | | | |
|---|---|---|---|---|
| 4,835,704 A | * | 5/1989 | Eichelberger et al. | 716/9 |
| 4,914,658 A | * | 4/1990 | Stankov et al. | 372/18 |
| 5,627,854 A | * | 5/1997 | Knox | 372/99 |
| 5,812,308 A | * | 9/1998 | Kafka et al. | 359/346 |
| 5,834,160 A |   | 11/1998 | Ferry et al. | 430/313 |

FOREIGN PATENT DOCUMENTS

| | | |
|---|---|---|
| DE | 195 29 656 A1 | 2/1997 |
| EP | 0 818 858 A2 | 1/1998 |
| WO | WO 98/33096 | 7/1998 |

OTHER PUBLICATIONS

Kafka, J.D., et al., "Synchronously pumped optical parametric oscillators with $LiB_3O_5$", J. Opt. Soc. Am. B, vol. 12 (No. 11), pp. 2147–2157 Nov. 1995.

Specifications for the DirectPrint 40 Exposure System, Jenoptik Technologie GmbH, Germany, Oct. 1995.

* cited by examiner

*Primary Examiner*—Paul P. Gordon
(74) *Attorney, Agent, or Firm*—Paul Davis; Heller Ehrman White & McAuliffe

(57) ABSTRACT

A lithography system for providing interconnections of integrated circuits on a substrate includes a laser system with a high reflector and an output coupler that define an oscillator cavity. A gain medium and a mode locking device are positioned in the oscillator cavity. A diode pump source produces a pump beam that is incident on the gain medium. A processor is coupled to the laser system and stores a representation of interconnections for the integrated circuit. An output beam directing apparatus is coupled to the processor and directs the output beam to the substrate and form the interconnections.

20 Claims, 8 Drawing Sheets

QUASI-CONTINUOUS WAVE LITHOGRAPHY APPARATUS AND METHOD

CROSS REFERENCE TO RELATED APPLICATIONS

This application cross-references U.S. patent application Ser. No. 09/322,803, filed May 27, 1999 entitled "Laser Writing Method and Apparatus", (issued as U.S. Pat. No. 6,246,706 B1); and U.S. patent application Ser. No. 09/321,499, filed May 27, 1999, entitled "Method and Apparatus to Detect a Flaw in a Surface of an Article", which applications are incorporated herein by reference.

BACKGROUND OF THE INVENTION

1. Field of the Invention

This invention relates generally to a method and apparatus for writing circuit patterns using a laser system, and more particularly to a method and apparatus for writing circuit patterns using a quasi-continuous wave (cw) laser engine.

2. Description of Related Art

Multichip integrated circuit packages have been produced in the past by arranging a plurality of individual integrated circuit chips on a common substrate and then covering the chips on the substrate with a polymer film overlay layer or layers. The via holes are formed and metalized interconnections between the pads of the individual chips are provided. However, by itself, this packaging technique is highly dependent on the precise and accurate placement of the chips on the substrate. What is needed especially for automated packaging of integrated circuit chips, is a procedure which is less dependent on the highly accurate placement of the chips on the substrate.

A polymer film covers a plurality of integrated circuit chips adjacent to one another on an underlying substrate. The polymer film provides an insulative layer upon which a metalization pattern for interconnection of individual circuit chips is eventually deposited.

The chips include interconnection pads for connecting to other integrated circuit components or for connecting to other parts of the same chip. Via openings or apertures in the polymer dielectric layer are aligned with the interconnection pads. The pattern of interconnection conductor is disposed on the overlying polymer film so as to extend between at least some of the via openings so as to provide electrical connections between various parts of a chip or between several chips.

Metalization is preferably provided by sputtering a one thousand angstrom thick layer of titanium, followed by a one micron thick layer of copper over the polymer film and into the via holes. The metalization is preferably patterned by spraying or spinning a coating of photoresist on the copper surface, drying for about one half hour at approximately 90° C. and exposing the positive resist material with a scanned ultraviolet (UV) laser beam under control of computerized artwork. A preferable photoresist material is Dynachem OFPR 800 photoresist.

To maximize the operating speed of the final system, interconnection from one chip to another is preferably accomplished with a minimum of capacitative loading and a minimum of interconnect length. Capacitative loading tends to slow down signal transmission such that high speeds attained on the chip cannot be maintained in communicating from one chip to another. Interconnection length between chips also contributes to propagation delay due to greater capacitative loading effects in the dielectric medium due to circuit length and also due to a self inductance of the interconnection circuit. The metalization is patterned to form very fine lines and spaces, typically under 1 mil in line width and 1 mil in line spacing.

The lithography system adapts to inaccurately placed chips by modifying database artwork patterns representing an ideal interconnect pattern so as to accommodate the actual position of integrated circuit chips. Commercially available chip placement devices are not sufficiently accurate to position chips with the resolution capability of a laser scan system.

Artwork is generated for the ideal positioning of integrated circuit chips using a computer-aided layout system. This computer-aided design system is provided with a first data base containing information as to the integrated circuit chips size, their ideal position and orientation if that is user specified, the location of connection pads on each integrated circuit chip and a list of the required connections among the various connection pads on the various integrated circuit chips. The computer-aided design system then provides a layout for the chips on the substrate and the printed circuit metalized conducting paths in the form of a second data base. The various conducting paths may preferably be stored in vector form as a series of straight line segments each specified by its starting and ending points. All interconnect, via hole definitions, and chip boundary definitions are stored in a file. The chip boundary definitions include an outline of a chip including its ideal position and orientation and an outline of the extent to which the chip can be misplaced. The actual positions and orientation of the integrated circuit components are determined from connection pad and chip outline information. Ideally, this process is performed automatically by using a charge-injection device (CID) camera and an image recognition technique to align each circuit chip and calculate offset and rotation information. In the process actually implemented and described hereinafter, the process is partly manual. More specifically, the substrate is aligned on the x-y table in both location and rotation according to fiducial marks on the substrate. The monitor for the CID camera is equipped with a bull's-eye or cross-hair pattern on the center of the screen. When the fiducial mark on the substrate which corresponds to the mirror zero position is near the bull's eye, the x and y position counters are reset to zero. The computer then supplies pulses to x and y stepping motors to step to the ideal position of the upper right hand pad of the integrated circuit chip. A mouse connected to the computer is used to move the image of one pad of the actual chip directly under the cross-hairs. The difference between the actual position and the ideal position is recorded. Then the computer steps the x-y table to the expected position of a pad on the opposite side of the integrated circuit chip, making the assumption that the chip is not rotated from the ideal position. The mouse is used again to position the image of the actual pad directly under the cross hairs. Again, the difference between the actual position and the ideal position is recorded. The offset and rotation of the actual chip is then recorded from the results of the two operations. The computer then goes to the next chip in sequence and determines its offset and rotation and this process is repeated until the offset and rotation of all the chips have been recorded. The information determined during this step is stored in a database which defines the chip positions. The ideal artwork is modified to match the actual chip position. All of the interconnect patterns and associated via holes are modified to incorporate the offset and rotation associated with each integrated circuit chip. The modified artwork is used to drive the adaptive lithography scanning system. The modified artwork is used to supply the commands for positioning the x-y table and to supply data to the high speed processor for driving the adaptive lithography scanning system and for modulating the laser beam so that a modified printed circuit pattern can be printed on the substrate.

The structure of the adaptive lithography system includes a primary laser beam path which starts from a quasi-cw laser system which is adjusted with optics to provide ultraviolet (UV) output. The laser provides a single beam which may be divided, with beam splitting optics, into as many beams as are required. The laser beam is then passed through an acousto-optical modulator which deflects the beam when a high frequency signal is applied. A plate with an aperture is positioned approximately one meter from the output of the modulator. The non-deflected beam is stopped by the plate and the deflected beam passes through the aperture.

The deflected beam is expanded to the desired diameter laser beam with a beam expander. The expanded beam is directed to a galvanometer driven scanner which has a (9-millimeter) diameter scanning mirror and an internal sensor which is coupled with a servo-amplifier to accurately position the mirror. The scanned beam is focused onto a substrate with a conventional plano-convex lens. A second laser is used to accurately determine the position of the scanning mirror at all times during the scan. The second laser beam is passed through a graticule and focused on a PIN diode detector.

A CID camera with a microscope objective is mounted to observe the area on the substrate where the laser beam focuses. Precise correlation between the laser beam position and the image of the CID camera is obtained. The substrate is positioned on a precision x-y table, which is positioned by precision screws attached to separate motors. The CID camera is connected to a video subsystem which drives a television display.

A microcomputer, such as a MS-DOS personal computer (PC), manages the process and dataflow. An input/output board connects special control electronics which manage the motion of the x-y table to the PC. The image data from the CID camera is sent through an interface board to a high speed processor which generates bit map patterns of the artwork stored in vector form. The control electronics for the adaptive lithography system can be divided into three major sections which are: x-y table control, mirror scan control, and laser data control. Circuitry is included which assures that the x-y table is in exact synchronism with the position of the scanning mirror. The lithography system operates by converting a file stored in rectangular vector form to a controlled flow of data which modulates a laser beam in synchronism with its position on the substrate to be exposed.

The system can be expanded to achieve higher throughput rates at a substantial savings by duplicating only essential parts of the device. The system can be duplicated as many times as required to obtain the desired throughput rate. The acousto-optic modulator, the expander, the scanner, and the focus lens as well as the alignment laser and the graticule must be duplicated. The x-y table, the CID camera, the PC, the laser and other equipment need not be duplicated.

There is a need for a lithography system and method for producing finer line widths. There is a further need for a lithography system and method for producing more precise integrated circuit interconnections.

SUMMARY OF THE INVENTION

Accordingly, an object of the present invention is to provide an improved lithography system and method.

These and other objects of the invention are achieved in a lithography system for providing interconnections of integrated circuits on a substrate. Included is a laser system with a high reflector and an output coupler that define an oscillator cavity. A gain medium and a mode locking device are positioned in the oscillator cavity. A diode pump source produces a pump beam that is incident on the gain medium. A processor is coupled to the laser system and stores a representation of interconnections for the integrated circuit. An output beam directing apparatus is coupled to the processor and directs the output beam to the substrate and form the interconnections.

DETAILED DESCRIPTION OF PREFERRED EMBODIMENTS

Figure 1:
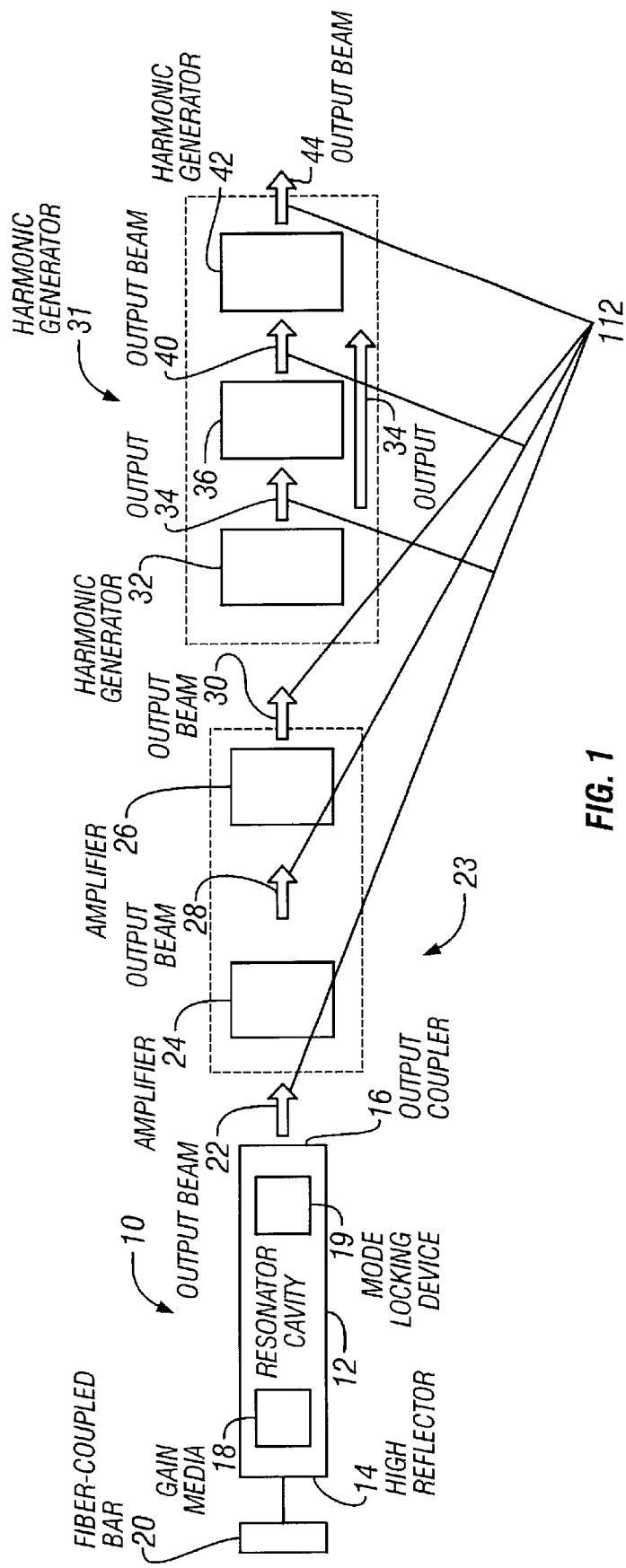
FIG. 1 is a block diagram of a laser, laser/amplifier system useful with the present invention.

The present invention provides an inspection apparatus that includes a laser system. The laser system includes an oscillator system or an oscillator/amplifier system. The oscillator/amplifier system is similar to the oscillator system but includes one or more amplifiers. The oscillator and oscillator/amplifier systems can be coupled with second, third, fourth and fifth harmonic generators. A second harmonic generator can be used alone with the oscillator and oscillator/amplifier systems and in various combinations with third, fourth and fifth harmonic generators. Additionally, the harmonic generators can be coupled with an OPO. The OPO can be pumped by a fundamental beam from an oscillator or from the harmonic generators. An output of the OPO can be mixed with the harmonic generators to generate a variable wavelength source.

In one embodiment, the oscillator system includes an Nd:YVO$_4$ gain media and is mode locked by a multiple quantum well absorber. In a specific embodiment of this oscillator system, the oscillator is pumped by a single fiber-coupled diode bar that provides 13 watts of pump power incident on the Nd:YVO$_4$ gain media, and typically produces 5–6 watts of 5–15 picosecond pulses at 80 MHz repetition rate.

In another embodiment, an oscillator/amplifier system includes an Nd:YVO$_4$ gain media mode locked by a multiple quantum well absorber, a double pass amplifier and two single pass amplifiers. Each of the amplifiers has an Nd:YVO$_4$ gain media and is pumped by two fiber-coupled diode pump sources. This oscillator/amplifier system produces 25–30 watts of 5–15 picosecond pulses at 80 MHz repetition rate.

The oscillator and oscillator/amplifier systems can be mode locked with a multiple quantum well saturable absorber, a non-linear mirror mode locking method, a polarization coupled mode locking method or other mode locking techniques, including but not limited to use of an AO modulator. An example of a quantum well saturable absorber is disclosed in U.S. Pat. No. 5,627,854, incorporated herein by reference. An example of a non-linear mirror mode locking method is disclosed in U.S. Pat. No. 4,914,658, incorporated herein by reference. An example of a polarization coupled mode locking method is disclosed in U.S. Pat. No. 6,021,140, incorporated herein by reference. In order to producer shorter pulses and a single output beam the gain media is positioned adjacent to a fold mirror as described in U.S. Pat. No. 5,812,308, incorporated herein by reference.

A high power oscillator system with the performance of an oscillator/amplifier system is achieved by using multiple fiber-coupled diodes and either a non-linear mirror mode locking technique or a polarization coupled mode locking method. This high power oscillator system produces 10–20 watts of output power with 4–10 picosecond pulses at a repetition rate of 80–120 MHz. High repetition rates are desirable for applications where the laser system is used as a quasi-CW source. For some applications, 80 MHz repetition rate is sufficiency high to be consider to be quasi-CW. This repetition rate is achieved with an oscillator cavity length of 1.8 meters. When the cavity length is shorted to 0.4 meters the repetition rate increases to 350 MHz.

Referring now to FIG. 1, one embodiment of an oscillator system 10 has a resonator cavity 12 defined by a high reflector 14 and an output coupler 16. A gain media 18 is positioned in resonator cavity 12. Suitable gain media 18 include but are not limited to, Nd:YVO$_4$, Nd:YAG, Nd:YLF, Nd:Glass, Ti:sapphire, Cr:YAG, Cr:Forsterite, Yb:YAG, Yb:glass and the like. A preferred gain media 18 is Nd:YVO$_4$. A mode locking device 19 is positioned in oscillator cavity 12. In the embodiment, oscillator system 10 is mode locked and pumped by a fiber-coupled bar 20 that produces 13 watts of power. Oscillator cavity 12 can produce 1 to 6 watts of power nominally at a 80 MHz repetition rate with pulse widths of 5 to 15 picoseconds.

Optionally included is one or more amplifiers, generally denoted as 23. An output beam 22 from resonator cavity 12 can be amplified by a first amplifier 24. A second amplifier 26 can be included. Additional amplifiers may also be included to increase power. Typically, amplifiers 24 and 26 have the same gain media used in resonator cavity 12. Nd:YVO$_4$ is a suitable gain media material because it provides high gain in an amplifier. The higher gain of Nd:YVO$_4$ provides a simplified amplifier design requiring fewer passes through the gain media. Amplifiers 24 and 26 produce output beams 28 and 30 respectively. Amplifiers 24 and 26 can be single pass, double pass and four pass. A four pass amplifier is disclosed in U.S. Pat. No. 5,812,308, assigned to the same assignee as this application and incorporated herein by reference. Oscillator/amplifier system 10 using an oscillator, a double pass amplifier and two single pass amplifiers can provide 30 watts of average power.

Output beams 22, 28 or 30 can be incident on a harmonic generator generally denoted as 31 and can include a second harmonic generator 32. An output 34 from second harmonic generator 32 can be incident on a third harmonic generator 36 to produce an output beam 40. Output 34 can be incident on a fourth harmonic generator 42 to produce an output beam 44. It will be appreciated that oscillator system 10 can include various combinations of harmonic generators 32, 36, 42 as well as a fifth harmonic generator or an OPO. Second harmonic generator 32 can use non-critically phase matched LBO, third harmonic generator 36 can employ type II LBO and fourth harmonic generator 42 can use type I BBO.

In a specific embodiment (not shown), oscillator system 10 includes oscillator cavity 12 with harmonic generation. In this specific embodiment, oscillator system 10 includes second harmonic generator 32 and may also include third and fourth harmonic generators 36 and 42. The output power of this oscillator system 10 is 5 watts at 1064 nm. With up to fourth harmonic generation, the system produces 2 watts at 532 nm, 1 watt at 355 nm and 200 milliwatts at 266 nm.

In another specific embodiment, Nd:YVO$_4$ is the gain media of oscillator/amplifier system 10, and 29 watts of 7 picosecond pulses at 1064 nm is produced. The harmonic generation system can generate 22 watts at 532 nm or 11 watts at 355 nm or 4.7 watts at 266 nm.

In another specific embodiment, oscillator/amplifier system 10 includes oscillator cavity 12, a four pass amplifier 24 and second harmonic generator 32 to produce 2 watts at 532 nm. This oscillator/amplifier system can pump an OPO that utilizes non-critically phase matched LBO as described in Kafka, et al., J. Opt. Soc. Am. B 12, 2147–2157 (1995) incorporated herein by reference.

In another specific embodiment, oscillator/amplifier system 10 includes oscillator cavity 12, a double pass amplifier 24 and three single pass amplifiers 26 that produces 42 watts of 7 picosecond pulses at 1064 nm. This oscillator/amplifier system can pump an OPO using non-critically phase-matched KTA and produce an output beam at 1535 nm. The output beam at 1535 nm can be mixed with a 1064 nm beam to provide 11.6 watts at 629 nm, as described in Nebel, et al., in *Conference on Lasers and Electro-Optics,* Vol. 6 of 1998 OSA Technical Digest Series (Optical Society of America, Washington, D.C., 1998) postdeadline paper CPD3.

40 watts fiber-coupled bars, commercially available from Opto-Power, Tucson, Ariz. can be used to increase the output power of oscillator or oscillator/amplifier systems 10. The use of an Nd:YVO$_4$ gain media 18 with a doping level of less than 0.5% can also be used to increase the output power of oscillator or oscillator/amplifier systems 10. The combination of the 40 watt fiber-coupled bars with the low doped Nd:YVO$_4$ gain media greatly increases the output power of oscillator and oscillator/amplifier systems 10. Use of low doped Nd:YVO$_4$ gain media 18 can also reduce the sensitivity of oscillator cavity 12 to misalignment as well as improve the output beam quality from an amplifier 24 or 26. The use of low doped Nd:YVO$_4$ gain media, a longer Nd:YVO$_4$ gain media as well as a larger pump volume in Nd:YVO$_4$ gain media is disclosed in commonly owned application Ser. No. 09/199,031, filed Nov. 24, 1998, incorporated herein by reference.

Hereafter, oscillator system and/or oscillator/amplifier system 10, shall collectively be referred to as laser system 110, and output beams 22, 28, 30, 34, 40 or 44 are collectively denoted as output beam 112.

The invention includes a lithography system with laser system 100.

Figure 2:
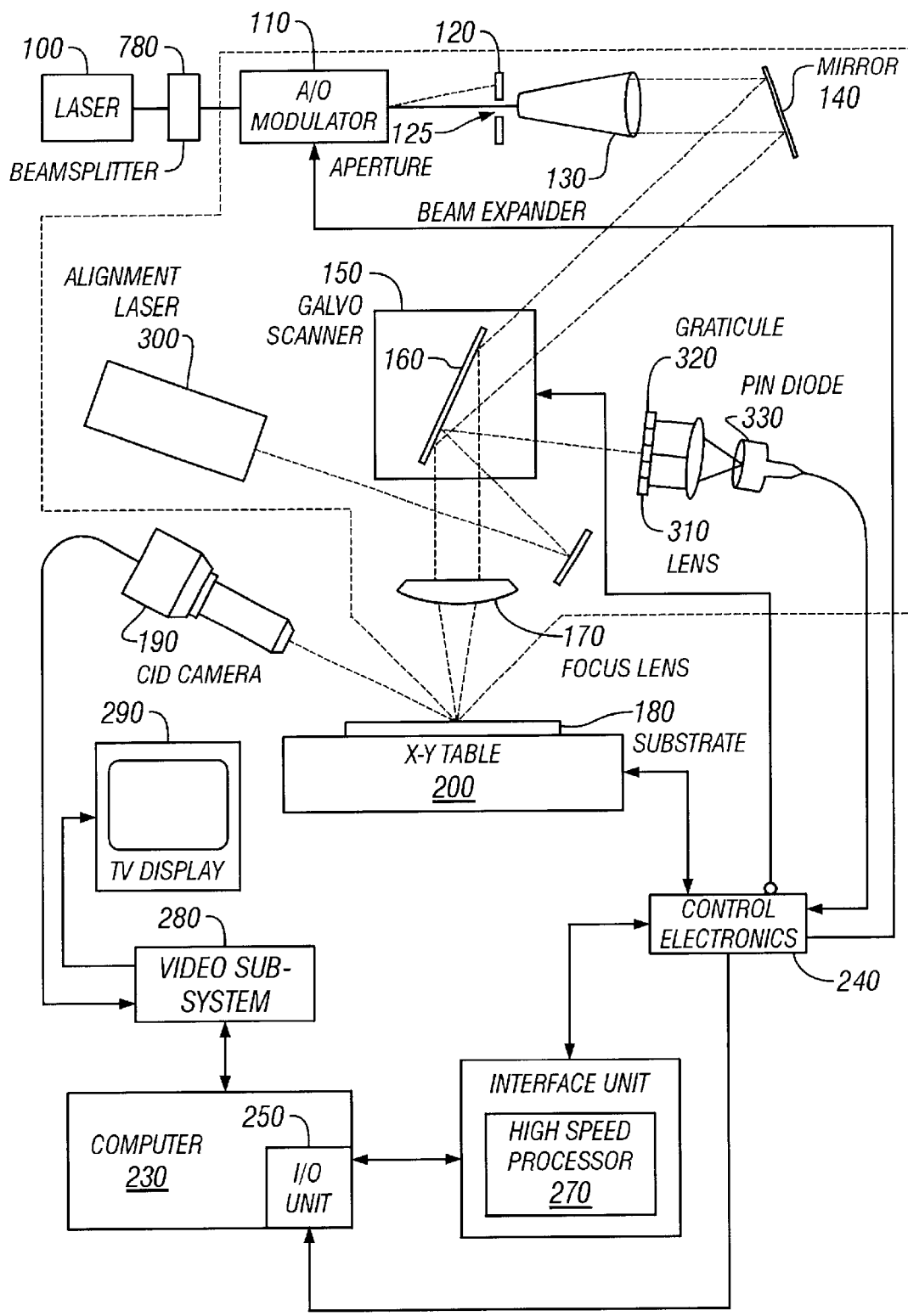
FIG. 2 illustrates a block diagram of adaptive lithography system showing the portions to be duplicated for multiple substrates, representing an embodiment of the invention.

Referring now to FIG. 2, laser system 100 is adjusted with optics for an output of approximately 0.4 watt in the ultraviolet (UV) range. The laser beam is passed through an acousto-optical modulator (A/O) 110 to a plate 120 having an aperture 125. The acousto-optical modulator (A/O) 110 deflects the beam when a high frequency signal is applied to the acousto-optical modulator 110 from control electronics 130. The acousto-optical modulator 110 may be a Newport Optics Systems Quartz Modulator. An undeflected beam is stopped by a plate 120 which is positioned approximately one meter from acousto-optical modulator 110, while a deflected beam passes through the aperture 125 to beam expander 130 which expands the laser beam in accordance with the diffraction limits to achieve a desired size focussed laser spot. The beam expander may be an Oriel Model 1510. An ultraviolet grade aluminum coated mirror 140 is used to deflect the expanded beam into proper alignment with a galvanometer driven scanner 150. The scanner 150 may be a General Scanning 120 D.C. galvanometer scanner. Scanner 150 preferably has a scanning mirror 160 and an internal sensor which can be coupled with a servo-amplifier for accurate positioning. The scanned beam can be focused with a plano-convex focus lens 170 having a focal length of approximately 10 cm onto substrate 180. A CID camera 190 with a microscope objective can be mounted to observe the area on substrate 180 where the laser beam is focussed. The CID camera may be a General Electric Model TN 2505A2. Substrate 180 is placed on a precision x-y table 200 which is positioned by precision screws 210 (shown in FIG. 3), attached to separate motors 221 and 222 (also shown FIG. 3). Precision x-y table 200 may be obtained from New England Affiliated Technologies. Referring again to FIG. 2, computer 230 manages the dataflow in the adaptive lithography system. The computer 230 may be a Pentium based PC. Control electronics 240 which control the motion of x-y table 200 are connected to computer 230 by input/output board 250. The input/output board 250 may be of the type made by Techmar. An interface unit 260 interfaces high speed processor 270 with computer 230. The interface unit 260 may be a Sky 320 PC board made by Sky Computers of Lowell, Mass., which contains high speed processor 270 in the form of a TMS 320-10 chip made by Texas Instruments. High speed processor 270 is used to generate bit map patterns from artwork stored in vector form and to process image data from CID camera 190. The CID camera 190 is connected to video subsystem 280 which drives a television display 290 and communicates with the computer 230. The video subsystem 280 may be a Data Translation DT2803 unit. The position of scanning mirror 160 can be accurately determined with the use of an alignment laser 300. The alignment laser 300 may, for example, include a 0.5 milliwatt helium neon laser from Spectra Physics. The alignment laser 3900 emits a beam which is deflected by scanning mirror 160 and passed through a graticule 310. The beam is then focussed by a lens 320 onto a PIN diode detector 330.

Figure 3:
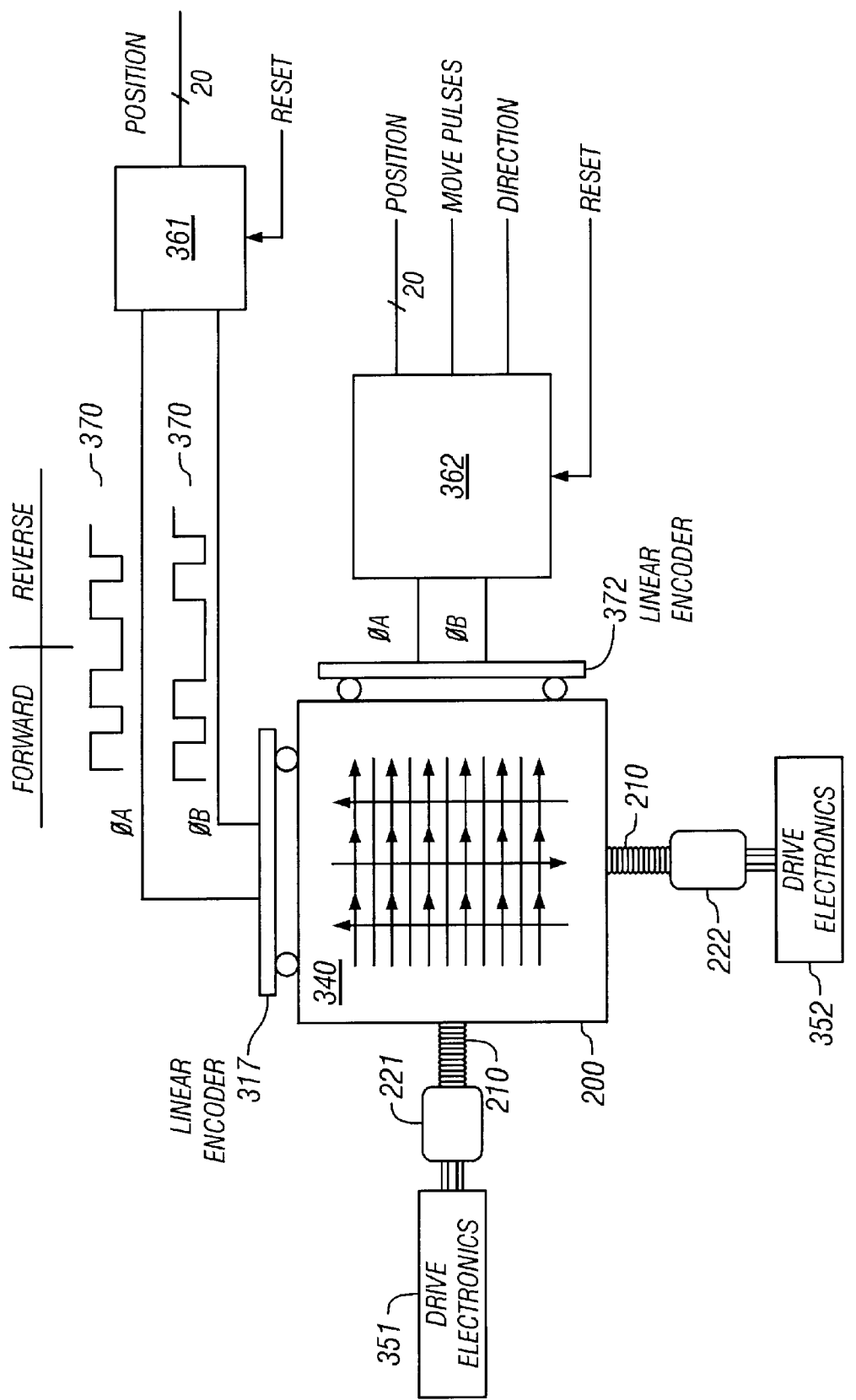
FIG. 3 illustrates a schematic view of an x-y table drive and position sensor, representing an embodiment of the invention.

FIG. 3 shows details of the x-y table drive and position sensing equipment, as well as a map of a raster scan pattern 340 traced by the beam from the quasi-cw laser system (not shown in FIG. 3). Separate stepper motors 221 and 222 drive precision screws 210 to position the x-y table 200. Drive electronics 351 and 352 receive pulsed information from control circuitry 361 and 362 and then translate the information into movement by stepping x-y table 200 via stepper motors 221 and 222, so as to move the table 200 to the desired location. Linear encoders 371 and 372 attached to the edges of the x-y table 200 encode the table position to a resolution of approximately one micron with a standard format two-phase, ninety degree square wave pattern 370. Phase A ($\phi_A$) always transitions before phase B ($\phi_B$). Circuitry 361 and 362 decodes the motion and direction of the table 200. Circuits which can detect motion and direction of motion are well known in the art. For example, Bausch and Lomb supplies a decoding circuit for use with their linear scales which features a digital readout in micro inches and microns. An up/down counter (described in more detail below) provides a binary value which corresponds to the number of microns moved. A reset signal is used to zero the up/down counter and, thereby, to establish a reference point. After zeroing, all positions are measured relative to the position of the x-y table 200 where the up/down counter was reset. The scanning mirror 160 can scan back and forth deflecting the laser beam on the x-axis in a saw tooth pattern. For example; the scan can progress from left to right for a period of approximately one and a half milliseconds, and then quickly return to the left most position in half a millisecond. Each scan would then cover a distance of approximately six millimeters. As the laser is scanned in a direction on the x-axis by scanning mirror 160, table 200 is moved at a constant speed in a direction on the y-axis. When the laser beam reaches the edge of x-y table 200, x-y table 200 is moved to the right six millimeters and then begins to move at a constant rate in the opposite direction on the y-axis.

Figures 1, 4A:
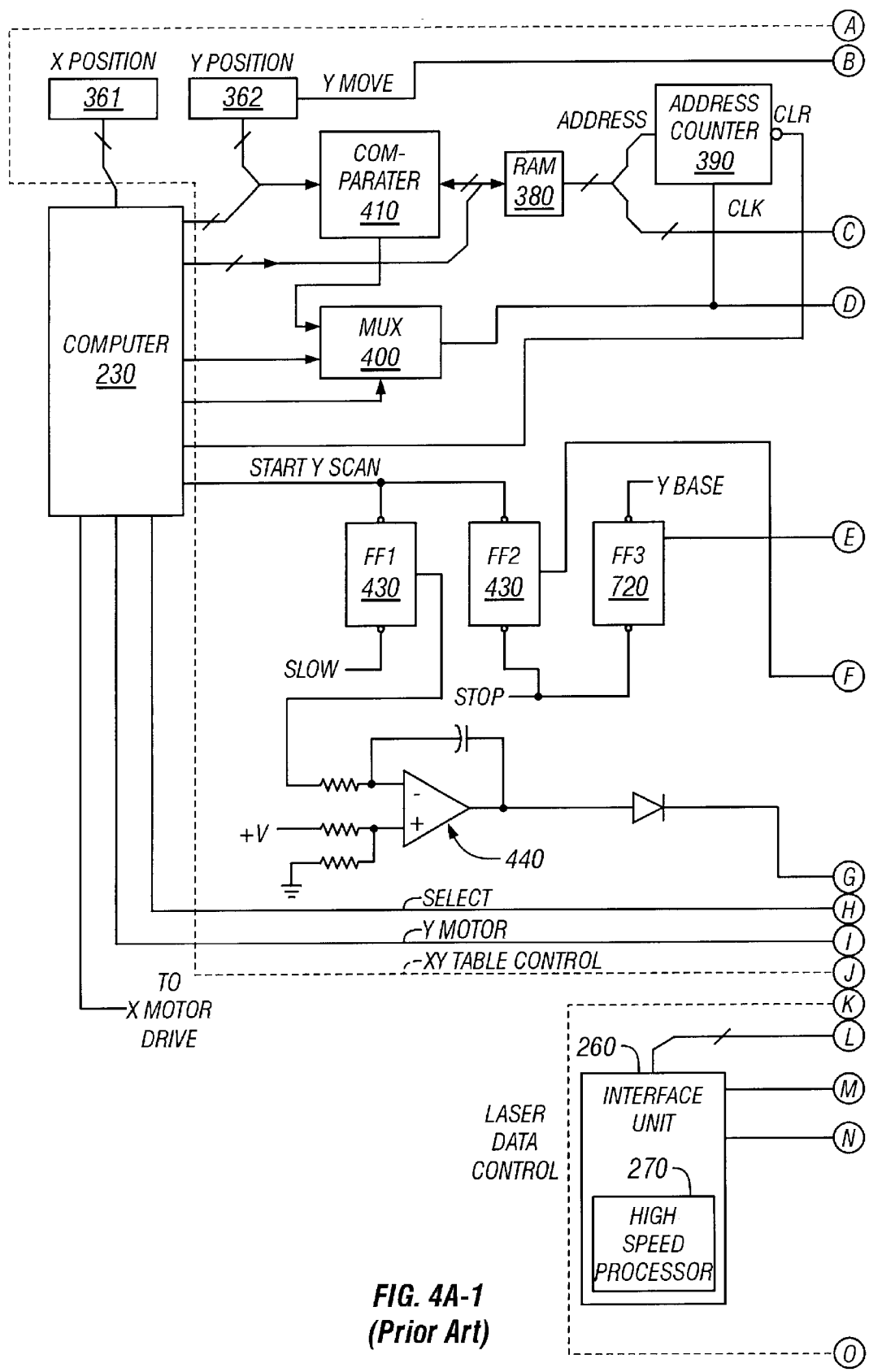
FIGS. 4A(1), 4A(2) and 4B illustrate circuit diagrams for the control electronics, representing an embodiment of the invention.
Figure 4B:
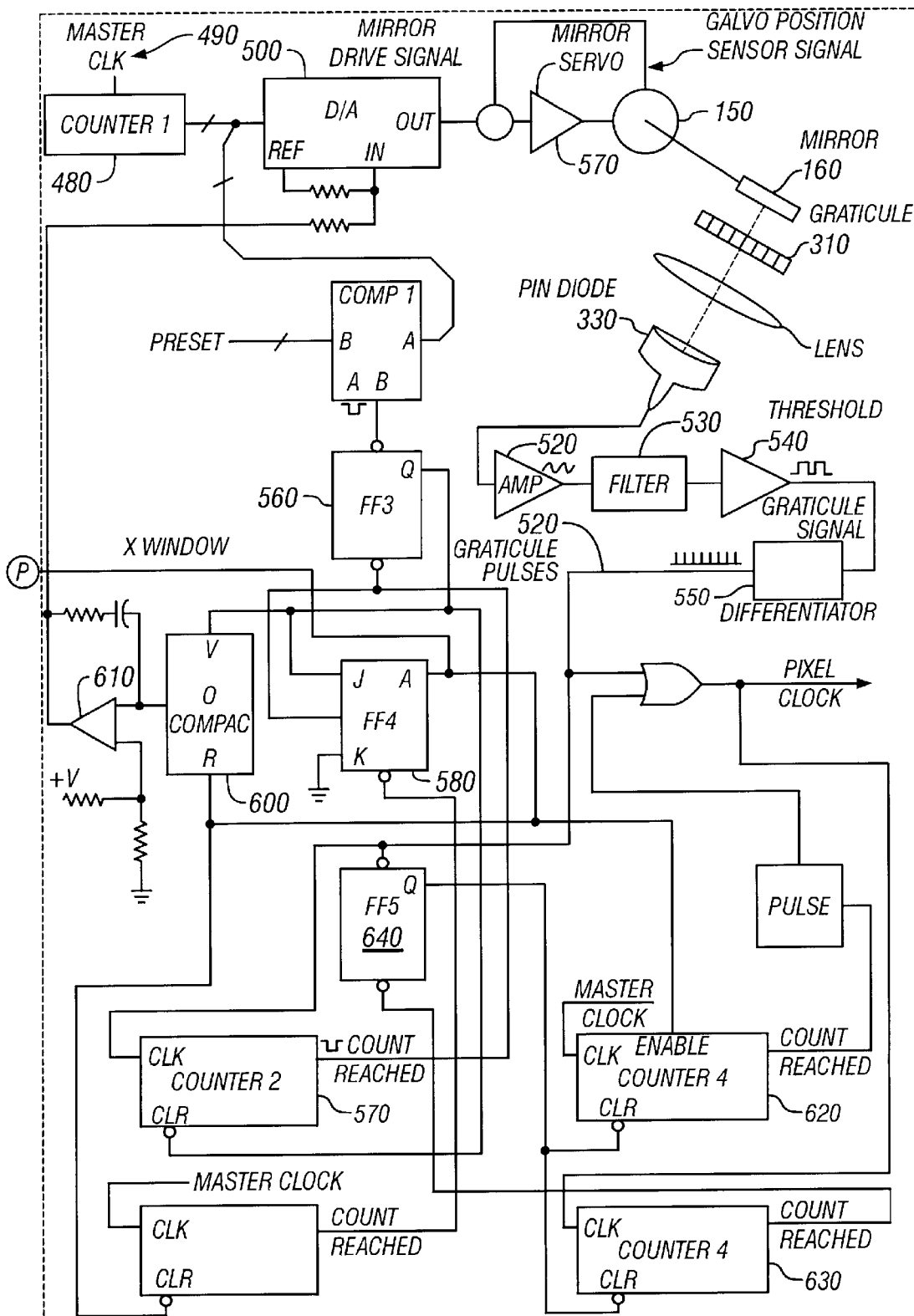
Figure 5:
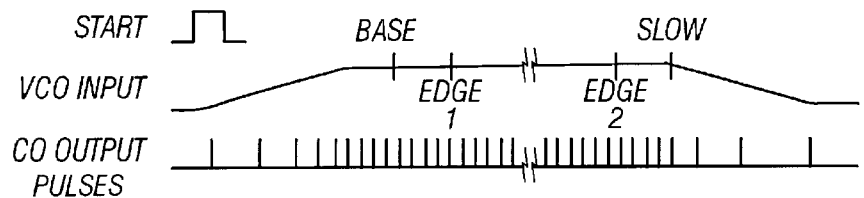
FIG. 5 illustrates a graphical representation of start-run and stop-timing of the system, representing an embodiment of the invention.

The mirror scan and table movement are synchronized so that the laser spot is accurately positioned. FIGS. 4A and 4B show a detailed block diagram of the control electronics used in one embodiment of an adaptive lithography system. The control is divided into three sections, which are: x-y table control, mirror scan control, and laser data control. The x-control portion is accomplished by the x position sensor in circuitry 361 which is connected to an input port in the computer 230. Pulses are supplied from the computer 230 to drive electronics 352 (not shown in FIGS. 4A and 4B) for x-direction stepping motor 221 (not shown in FIGS. 4A and 4B). The output of the x position sensor is compared in the computer 230 with the desired x position. Pulses are again supplied by the computer 230 to the stepper motor 221. The cycle is continued until the desired x position and the actual x position match within plus or minus one micron, or less. The y position control has a mode identical to the x position control in which the computer 230 controls the position accuracy, but it also has a mode in which x-y table 200 is scanned at a fixed speed in synchronism with scanning mirror 160 (not shown in FIGS. 4A and 4B). The circuit is configured to operate in a self-standing mode, controlling acceleration, speed synchronization, and deceleration so that computer 230 is free to oversee the high speed data transfer of the image data for the patterns. Five words of data are supplied which represent specific y positions for x-y table 200, these are: base (a base position), edge 1 (the first edge of the substrate), edge 2 (the opposite edge of the substrate), slow (the position where deceleration should begin), and stop (the position where the x-y table 200 should stop). This data is written to a random access memory (RAM) 380 by clearing an address counter 390 and clocking the address counter 390 from computer 230. For each new address, data is applied to the RAM 380 and then a write pulse is supplied. When the data has been written, address counter 390 is cleared to the first address and a multiplexor 400 is switched such that the address counter clock is supplied from the output of a comparator 410. Comparator 410 compares the present y position and the position stored in the RAM 380 at the location addressed by the address counter 390. The first address location would be the base y position. When the actual y position is the same as that stored in the RAM 380, a pulse is issued from the comparator 410. This pulse clocks the address counter 390 to the next storage location in the RAM 380. A decoder circuit 420 is connected to the address and clocked by the comparator 410. As a result, the base, edge 1, edge 2, slow, and stop locations are identified for use by appropriate control circuitry, FIG. 5. Scanning is started when a pulse is issued from the computer 230 to SR flip-flop 430. The output of the flip-flop 430 is connected to an integrator 440 whose output is connected to a voltage controlled oscillator (VCO) 450. The output of the VCO 450 is connected to y drive electronics 351 for controlling the stepping motor 221 (not shown in FIGS. 4A and 4B). The result of the arrangement is that as the integrator 440 integrates up, the voltage of the VCO 450 is increased, and a stepping motor accelerates x-y table 200 (not shown in FIGS. 4A and 4B).

Figures 2, 4A:
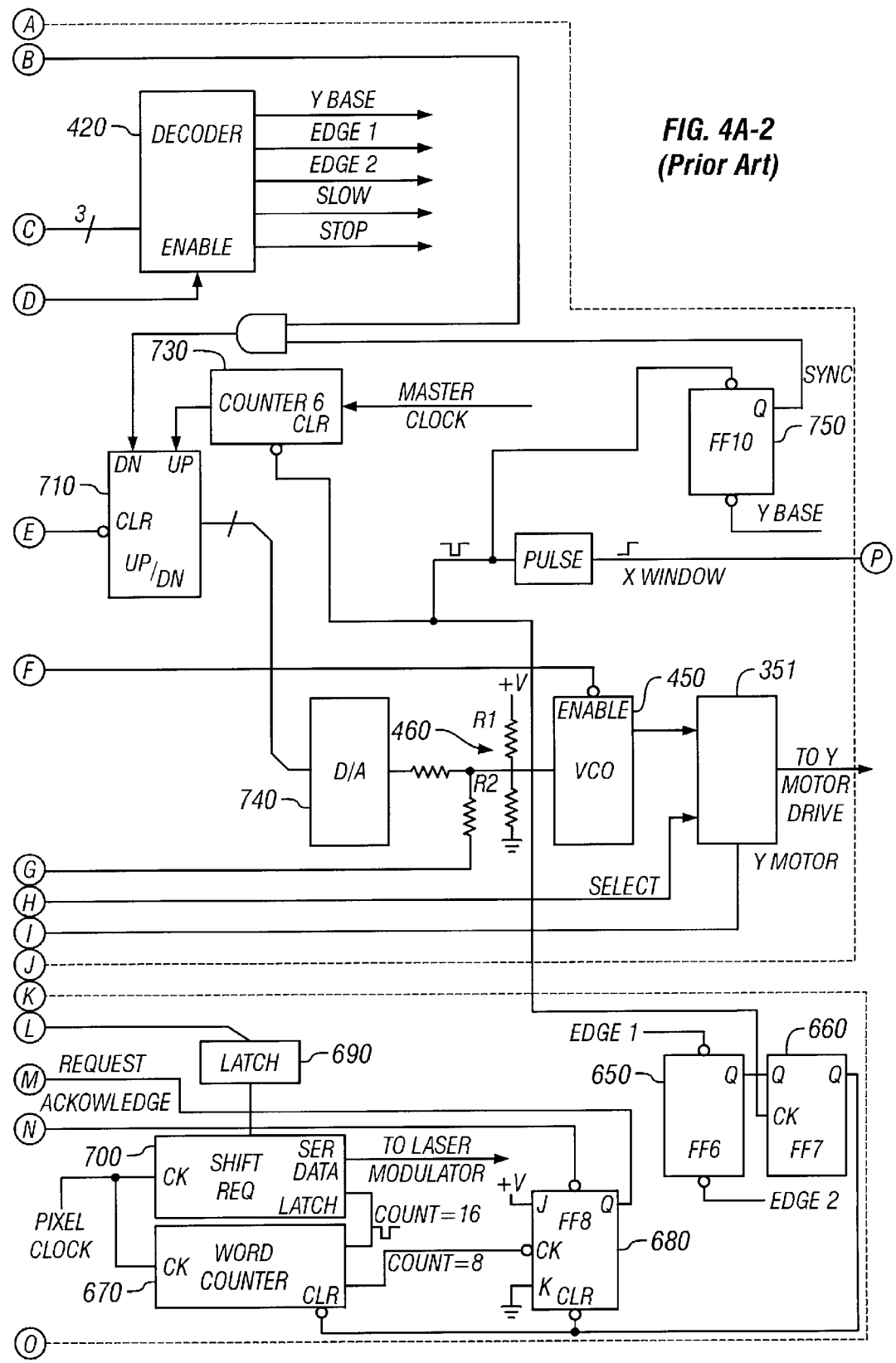

The start-run and stop-timing of the system is shown in FIG. 4. It is understood that as the integrator 440 continues to integrate, it eventually reaches a voltage greater than the voltage set by a resistive divider 460 composed of resistors $R_1$ and $R_2$. At this point diode D1 is cut off and the voltage to the VCO 450 no longer rises. The speed of the x-y table 200 then remains essentially fixed with the x-y table 200 continuing to move at essentially a constant speed until the slow position stored in the RAM 380 is traversed. The slow pulse resets the flip-flop 430, and integrator 440 integrates downward. The VCO 450 decreases the speed of the stepper motor 221 at a fixed ramp rate. When the stop position is traversed, a pulse is issued to a flip-flop 470 which then completely disables the VCO 450 and, therefore, no further pulses are sent to the drive electronics 351. Additional circuitry provided in the x-y control allows synchronization of the x-y table position with the mirror scan. This circuitry is connected to provide a vernier adjustment of the approximately constant speed voltage provided to the VCO 450 by the resistor divider 460.

The mirror scan control (see FIG. 4B) provides a basic scan signal to mirror 160, and a vernier adjustment of that scan signal so that the time to traverse a particular angle exactly matches the desired scan rate. In addition, a circuit is provided for very accurately determining the position of the mirror during the active data portion of the scan and for supplying clock pulses to clock data to modulator 110 such that the data supplied corresponds exactly to the position of the laser spot on the substrate being exposed.

Figure 6:
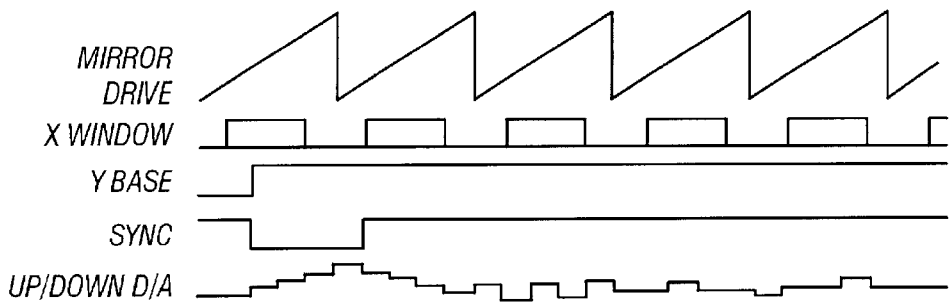
FIG. 6 illustrates a graphical representation of mirror scan and pixel clock timing, representing an embodiment of the invention.
Figure 7:
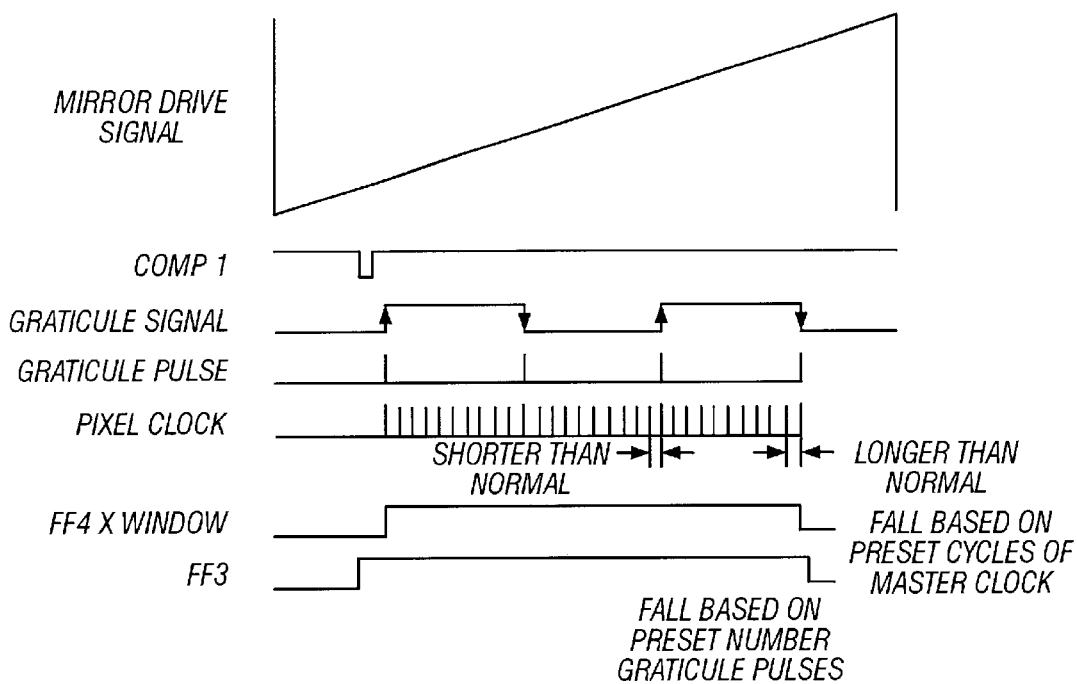
FIG. 7 illustrates a graphical representation of timing of the x-y table synchronized to the mirror scan, representing an embodiment of the invention.

FIG. 6 shows a timing diagram for the important waveforms shown in the mirror scan control circuit. Referring to FIGS. 4B and 6, the basic position drive is derived from counter 480 which counts pulses from master clock 490 and outputs the count to a digital-to-analog converter 500. The output from digital-to-analog converter 500 is a sawtooth waveform and is the mirror drive signal. The period of the sawtooth is directly related to master clock 490 which is used for timing synchronization throughout the scan control system. In the embodiment illustrated, counter 480 overflows when the count reached is 2,048 and then counter 480 starts over again at zero. The mirror drive signal is applied to mirror servo circuit 510 which provides a drive to galvanometer mirror scanning device 150. Galvanometer scanner 150 is equipped with a position sensor which feeds back information to the mirror servo circuit 510 to allow the mirror to be quickly driven to positions directly corresponding to the mirror drive signal. Unfortunately, there is drift in the mirror position sensor and there is jitter in the position of the mirror 160 caused by bearing fluctuations. These effects cause the mirror position to be only approximate and not generally repeatable relative to the high level of accuracy required in the adaptive lithography system. For this reason, alignment laser 300 (not shown in FIG. 4B) is directed at scanning mirror 160 and the reflected alignment beam is passed through graticule 310 and focused on PIN diode 330. The output signal from PIN diode 330 is amplified by amplifier 520, filtered by filter 530, and thresholded by threshold detector 540 to provide a square wave signal which is exactly representative of the angular position of scanning mirror 160. Graticule 310 consists of opaque lines and clear spaces. The edges of the square wave signal output correspond to the edges of graticule 310. Graticule 310 contains fewer lines by a factor of ten than the number of pixels which must be scanned by mirror 160 onto substrate 180 (not shown in FIG. 4B) over the corresponding angle. Ideally, a one-for-one correspondence would be desired. Unfortunately, alignment laser 300 cannot be focused sufficiently well on graticule 310. Thus, a very low-level, unreliable signal otherwise would result which is highly dependent on dust particles and other contaminants landing on graticule 310. Pulse circuit differentiator 550 receives the output of threshold detector 540 to create a pulse on each edge (i.e., from black to clear as well as from clear to black, for use by the rest of the circuitry). The graticule signal and corresponding graticule pulses are shown in FIG. 7. Flip-flop 560 enables counter 570 at the time when counter 480 reaches a preset count which is chosen so that counter 570 is enabled slightly in advance of the sweeping of the main laser beam over the area to be exposed. The J input to flip-flop 580 is also enabled so that when the first graticule pulse occurs, flip-flop 560 is set and counter 248 is enabled. Counter 590 subsequently counts a preset number of master clock pulses before its output resets flip-flop 580. During this same interval, counter 570 counts a preset number of graticule pulses before its output resets flip-flop 560. The outputs of flip-flop 560 and flip-flop 580 are compared in a phase comparator circuit 600. The output of phase comparator circuit 600 drives amplifier 610 that provides a vernier control voltage to digital-to-analog converter 500 providing the mirror drive signal. Therefore, the angle of mirror 160 is controlled so that a fixed number of graticule pulses occurs during a fixed number of master clock pulses. As a result, the speed of mirror 160, while it is scanning the area on substrate 180 to be exposed, is synchronized to master clock 490. A drift in the mirror position servo circuit 510 is automatically compensated by this vernier control circuitry.

Unfortunately, mirror jitter, which is essentially a noise quantity, can cause the mirror to deviate more than one pixel element away from its ideal location. To eliminate this effect, the circuitry of counters 620 and 630, in conjunction with the graticule pulses, generates a pixel clock signal which is precisely related to the actual position of mirror 160. Counter 620 is clocked by master clock 490 and is enabled by flip-flop 580. Counter 630 is cleared by flip-flop 640. Flip-flop 640 is set by graticule pulses and reset by the output of counter 630. After counter 620 reaches a present count, its output causes a pulse to be issued. Counter 620 pulses are combined with the graticule signal pulses to form the pixel clock. This circuit portion works as follows: whenever a graticule signal occurs, counter 620 begins counting the master clock pulses; each time counter 620 overflows, a pulse is issued to the pixel clock; counter 630 counts the pixel clock and when nine pixel clock pulses have occurred, flip-flop 640 is reset; counter 620 and counter 630 are both cleared and must wait until another signal occurs; when another graticule signal occurs, a new pixel clock signal is issued. In this way, nine pulses equally spaced, occur in response to each graticule signal. An additional pulse, which is the tenth pulse in the series, is coincident with the graticule signal and is provided by pulse block 650. Hence the pixel clock is locked to the graticule signal. The graticule signal indicates the exact position of the scanning mirror 160 while there are ten time as many pixel clocks as there are graticule signal transitions. The pixel clock is used to identify each pixel position which is scanned by the laser.

The laser data control circuitry shown in FIGS. 4A and 4B indicates that high speed processor 270 is incorporated in the computer system using an interface board 260. A section of memory is shared between computer 230 and interface board 260. Data is stored on a disk in computer 230 in vector format such that each rectangle to be written is given an x minimum, a y minimum, an x maximum, and a y maximum. Vectors describe a line as two points. These two vectors then define any rectangle. A series of bits called a bit map is generated to turn the laser beam on and off as it scans substrate 180. High speed processor 270 calculates the bit map from the vector rectangle data. Only a small section of the total area to be scanned is covered by the bit map; in this embodiment of the invention a section which is 1,024 pixels wide by 256 pixels long is computed and stored. The 1,024 pixels correspond directly to the width of the active scan area scanned by scanning mirror 160, and the 256 pixel length corresponds to the y motion of the table which occurs during the 256 sequential scans of the mirror 160. High speed processor 270 processes the sorted vector data and places it in one section of ping-pong memory and subsequently sets up direct memory access pointers such that data is supplied sequentially from the pingpong memory whenever it is requested by the control electronics. A pingpong memory is one that has data read out of one half of the memory, as data is loaded into the other half. In the meantime, high speed processor 270 calculates the next set of 1,024 by 256 points and places this set in the second half of the pingpong memory. When the first half of the pingpong memory is exhausted, the direct memory access points are set to the other half, and high speed processor 270 begins computing the next bit map in order. Data is transferred from high speed processor 270 in 16-bit words. The data transfer process begins when flip-flop 650 is set by the first edge signal. This occurs when the first edge of substrate 180 to be scanned is directly under the laser scanning beam. Flip-flop 660 synchronizes this event with the x window signal which indicates that scanning mirror 160 is at the start of its scan position. At this point, word counter 670 and the requisite flip-flop 680 are reset. Word counter 670 begins to count pixel clocks and when eight pixel clocks have occurred, word counter 670 clocks flip-flop 680 which makes a request for data to the direct memory access circuitry of high speed processor 270. Data is supplied from high speed processor 270 to latch circuit 690 with a data acknowledged signal. Data is latched to latch circuit 690 and flip-flop 680 is reset. When sixteen pixel clocks have occurred word counter 680 indicates a pulse which loads data from latch circuit 690 to shift register 700. The output of shift register 700 is supplied to acousto-optical modulator 110. By this method, data is continuously supplied to shift register 700 and clocked by the pixel clock to modulate quasi-cw system 100 with the appropriate data for the exact position of the laser beam on substrate 180 to be exposed. When the far edge of the substrate is reached, the far edge signal resets flip-flop 650 and the next x window signal clocks flip-flop 660 which holds word counter 670 and flip-flop 680 in their inactive states.

The circuitry to accomplish synchronism between x-y table 200 and scanning mirror 160 is shown in FIGS. 4A and 4B in the x-y table control section. While x-y table 200 is accelerating to its nominal speed, up/down counter 710 is held in its zero position by the output of flip-flop 720. When x-y table 200 reaches the y base position flip-flop 720 is set, up/down counter 710 is enabled, and up pulses are supplied to up/down counter 710 from counter 730 which is clocked by master clock 490. Counter 730 is reset by an x window pulse such that output pulses from counter 730 are synchronized with the x window. The count for counter 730 is chosen so that six outputs occur for each x window pulse. This is because x-y table 200 travels six microns between sequential scans of scanning mirror 160. Down pulses are supplied to up/down counter 710 from y-position (sensor) control circuitry 362 on x-y table 200. Counter 710 remains at the zero position if the number of up pulses equals the number of down pulses. If more of one pulse than the other occurs, up/down counter 710 accumulates the pulses so that the output of digital-to-analog converter 740, connected to up/down counter 710 provides a voltage correction to VCO 450 to either increase or decrease the number of pulses to stepping motor 221 via control circuitry 351 and, thereby, to bring x-y table 300 motion back into synchronism with the mirror position. Flip-flop 750 enables the y-move pulses to be supplied to up/down counter 710. When the base signal occurs, flip-flop 750 is reset and y move pulses are not applied to the up/down counter 710. Flip-flop 750 is subsequently set by the x window transition indicating the beginning of the scan to scan mirror 160. Up pulses from counter 730 are accumulated in up/down counter 710 over the period from the occurrence of the y-base signal until the occurrence of the x-window signal. In this way, although there are six microns between each scan of the scanning mirror 160, the exact micron desired, as identified by y base, is forced to correspond to the starting of the mirror scan as identified by the rise of the x-window signal.

FIG. 6 shows the timing thus described where it is shown in the lowermost trace that up/down counter 710 accumulates from the onset of the y base signal to the rise of the x-window signal. At this point, the servo circuitry forces coincidence between x-y table 200 position and the counts synchronized to the x-window signal such that up/down counter 710 averages to zero with only plus or minus one count discrepancy. This means that x-y table 200 is held at speed to within one micron of the exact desired position corresponding to scanning mirror 160.

The operation of the adaptive lithography system has been explained in terms of converting a file stored in rectangular vector form to a controlled flow of data which modulates a laser beam in synchronism with its exact position on substrate 180 to be exposed. If all components could be positioned to sufficient accuracy, the laser could scan a fixed pattern of interconnect wiring. However, commercially available chip placement devices are not sufficiently accurate to position chips within the resolution capability of a laser scan system. In accordance with this invention, a method is disclosed for modifying artwork representing an ideal interconnect pattern to accommodate the actual position of the integrated circuit chips. The four major steps required are: generating artwork for the ideal case, determining the actual positions of each integrated circuit component, modifying the artwork to match the actual chip positions, and using the modified artwork to drive the adaptive lithography scanning system.

Ideal case artwork can be generated using a computer aided layout system or an automatic routing system. The article entitled "End-to-End Design" by Richard Angell on pages 97 to 119 of the November 1986 issue of PC Tech Journal describes the PCB-3 design system from P-CAD for generating and converting electronic schematics through placement and routing of printed circuit boards. The article entitled "PC Board Layout Via AutoCAD™" by Charles Jubb on pages 51 to 59 of the Volume 1, Number 2 issue of Cadence discusses overlay programs for the AutoCAD™ software package from Autodesk, Inc. An implementation of this invention uses an AutoCAD™ printed circuit layout device which allows various layers to be defined according to user selected spacing and user selected line width. The AutoCAD™ system runs on various microcomputers with a mouse input device to define the extent and position of the interconnecting lines. The AutoCAD™ system outputs a document exchange file (DXF) which contains a hierarchical structured definition of the artwork according to each layer.

Figure 8:
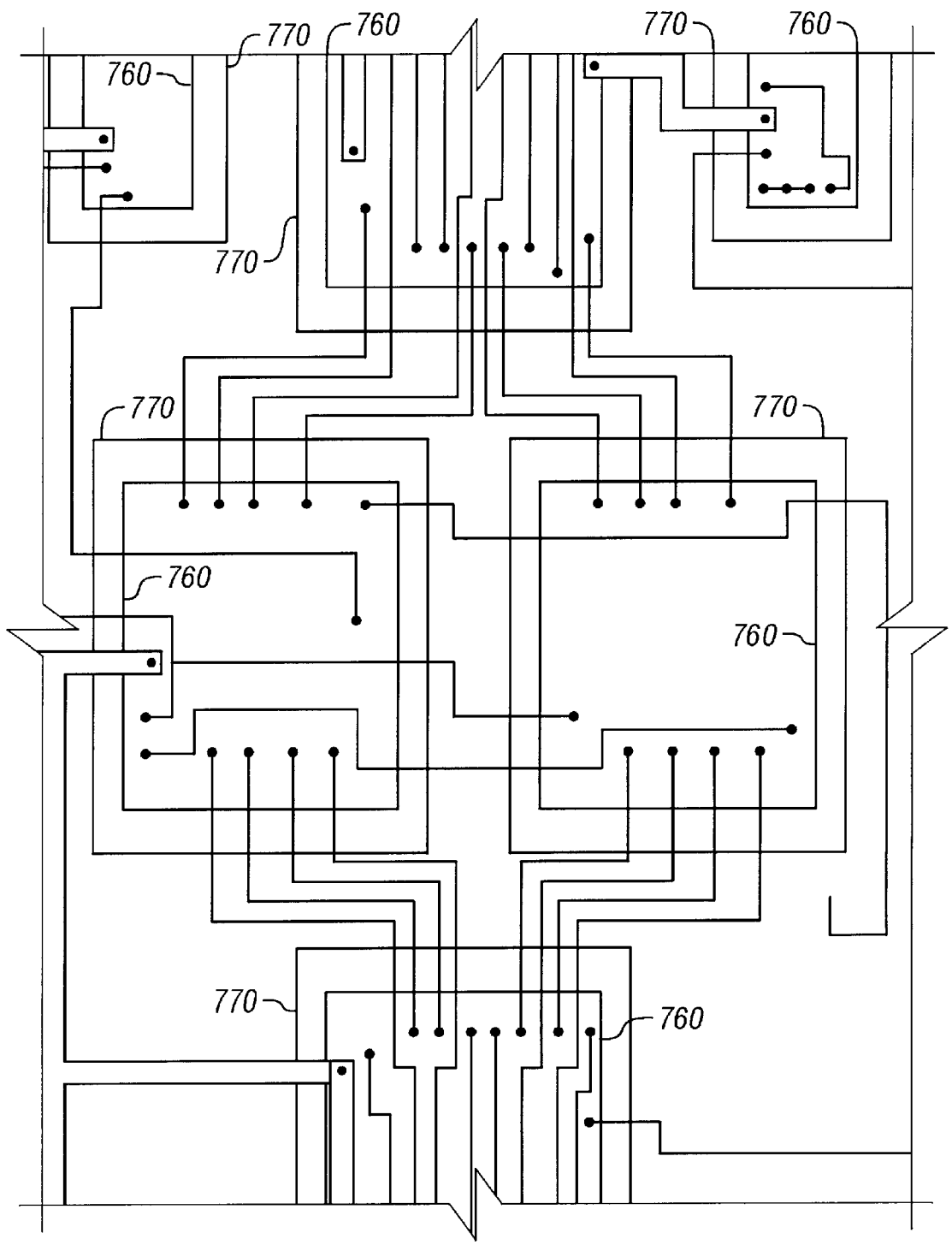
FIG. 8 illustrates a plan view of ideal artwork, representing an embodiment of the invention.

In the hierarchy, a block which defines the outline of each integrated circuit chip can be defined. FIG. 8 shows a portion of a simple interconnect pattern between the outlines 760 of several integrated circuits. An interconnect layer and a via layer shows the via interconnections from the conductors to pads on the chips. Second outlines 770 marks the limit of the extent to which the chip can be misplaced. The second outlines 770 can be changed depending on the positioning equipment used. A DXF file is stripped of its hierarchy in a process referred to as leveling so that the various important pieces of information can be used by other programs in the adaptive lithography system. Leveling creates all interconnect, via hole definitions, and chip boundary definitions according to a known format. A computer aided design (CAD) system can interface to the adaptive lithography system with only changes in the software which convert to the stripped level of data coding being necessary.

Via hole (i.e. the location of the via holes which are aligned with connection pads of the chip) and chip outline information are used to find the actual positions of each electronic component in the system. Ideally, this process is performed automatically with CID camera 190 using image recognition techniques to align each component and calculate offset and rotation information. The process can be partially manual. The substrates are first aligned on the x-y table 200 in terms of position and rotation according to fiducial marks on substrates 180 by observing a television monitor (display 290) which displays an image from CID camera 190. Television monitor 290 is equipped with a bull's eye or cross hair pattern on the center of the screen. When the fiducial mark on substrate 180 which corresponds to the zero position of mirror 160, is under the cross hairs, the x and y position counters, indicated by control circuitry 361 and 362 in FIG. 2, are reset to zero. Computer 230 now supplies pulses to x and y stepping motors, 221 and 222, respectively, to step to the ideal position of the upper right hand pad of the first integrated circuit chip. A mouse input device connected to computer 230 is used to move one pad of the actual chip directly under the cross hairs. The difference between the actual position and the ideal position is recorded. Next, computer 230 steps x-y table 200 to the expected position of a pad on the opposite side of the chip, making the assumption that the chip is not rotated from the ideal position. The mouse is then used to position the pad directly under the cross hairs. At this point, it is possible to compute both offset and rotation of the chip. Computer 230 then steps x-y table 200 to the next chip in the sequence with the process being repeated until the position and rotational offsets of all chips have been recorded. The information gathered is stored in a data base which defines the chip positions.

The ideal artwork generated in the first step and shown in FIG. 8 is then modified to match the actual chip position. Note that there are three distinct areas in this modified artwork. The first area is the interconnect pattern outside of second outline 770 which defines the degree to which the chip can be misplaced. In the first area the interconnect pattern is unchanged from the ideal case. The second area is the area that overlies integrated circuit chip outline 760 which defines the boundaries of the integrated circuit chip in question. All of the interconnect pattern and associated via holes are modified to incorporate the offset and rotation associated with the given integrated circuit chip. The third area is the area between the integrated circuit chip outline 760 and the second outline 770 defining the limit of misplacement of the chip. In this area interconnects which cross the boundary start from an unchanged position and end at the positions which are changed in offset and rotation according to the actual position of the chip.

The modified artwork is then used to supply the routines which position x-y table 200 and supply data to high speed processor 270 for the purpose of driving the adaptive lithography scanning system and modulating the laser beam to "paint" the appropriate modified pattern on the substrate to be exposed.

To obtain the desired throughput rate, the system can be duplicated as many times as required. FIG. 2 shows the parts of the system which should be duplicated separated from the parts of the system which can be shared. The duplicatable parts are enclosed in a dotted block. Beam splitter 780 is positioned in front of the laser system 100 to divide the single beam laser into as many beams as are required. Typically an input power of 0.2 watts is sufficient to expose photoresist. This is easily accomplished by dividing a 2 watt laser into ten beams. A substantial cost savings results from sharing x-y table 200, computer 230, CID camera 190, television display 290, video subsystem 280, alignment laser 300, and graticule 310, as well as dust elimination equipment and housing facilities. Acousto-optic modulator 110, beam expander 130, galvanometer scanner 150, and focus lens 170 must be duplicated for each laser beam. However, x-y table 200 and CID camera 190 need not be duplicated because all substrates 190 to be scanned can be mounted on a single table and only one CID camera is necessary to determine the position of each substrate 180. High speed processor 270 with latches and chip registers which drive the acousto-optic modulator 110 are also required for each substrate 180 so that the artwork for the substrate 180 can be converted from rectangle vector form to bit map form in real time.

The foregoing description of a preferred embodiment of the invention has been presented for purposes of illustration and description. It is not intended to be exhaustive or to limit the invention to the precise forms disclosed. Obviously, many modifications and variations will be apparent to practitioners skilled in this art. It is intended that the scope of the invention be defined by the following claims and their equivalents.

What is claimed is:

1. A lithography system for providing interconnections of integrated circuits on a substrate, comprising:

a laser system including a high reflector and an output coupler defining an oscillator cavity that produces an output beam, a gain medium with a doping level of less than 0.5% and a mode locking device positioned in the oscillator cavity, and a diode pump source producing a pump beam incident on the gain medium;

a processor that stores a representation of interconnections for the integrated circuit; and an output beam directing apparatus coupled to the processor that directs the output beam to the substrate to form the interconnections.

2. The lithography system of claim 1, wherein the output beam directing apparatus includes a scanner.

3. The lithography system of claim 1, wherein the output beam directing apparatus includes a rotatable reflector.

4. The lithography system of claim 1, wherein the output beam directing apparatus includes means for moving the substrate.

5. The lithography system of claim 1, wherein the gain medium is $Nd:YVO_4$, Nd:YAG, Nd:YLF, Nd:Glass, Ti:sapphire, Cr:YAG, Cr:Forsterite, Yb:YAG and Yb:glass.

6. The lithography system of claim 1, wherein the gain medium is $Nd:YVO_4$.

7. The lithography system of claim 1, wherein a second harmonic generator is made of LBO.

8. The lithography system of claim 1, wherein the diode pump source is fiber coupled.

9. The lithography system of claim 1, wherein the mode locking device is a multiple quantum well saturable absorber.

10. The lithography system of claim 1, wherein the mode locking device is a non-linear mirror mode locker.

11. The lithography system of claim 1, wherein the mode locking device is a polarization coupled mode locker.

12. The lithography system of claim 1, wherein the mode locking device is an acousto-optic modulator.

13. The lithography system of claim 1, wherein the output beam has a power of 10 watts or greater.

14. The lithography system of claim 13, wherein the output beam is pulsed at 4–10 picoseconds.

15. The lithography system of claim 14, wherein the output beam has a repetition rate of 80–120 MHz.

16. The lithography system of claim 1, further comprising:
   a second harmonic generator coupled to the oscillator cavity.

17. The lithography system of claim 16, further comprising:
   a third harmonic generator coupled to second harmonic generator.

18. The lithography system of claim 17, wherein the third harmonic generator is made of type II LBO.

19. The lithography system of claim 16, further comprising:
   a fourth harmonic generator coupled to the second harmonic generator.

20. The lithography system of claim 19, wherein the fourth harmonic generator is made of type I BBO.

* * * * *